United States Patent [19]

Riccio, Jr.

[11] 4,093,958

[45] June 6, 1978

[54] SEMICONDUCTOR DEVICE ASSEMBLY WITH IMPROVED FATIGUE RESISTANCE

[75] Inventor: Joseph F. Riccio, Jr., Mesa, Ariz.

[73] Assignee: Motorola, Inc., Schaumburg, Ill.

[21] Appl. No.: 748,791

[22] Filed: Dec. 9, 1976

[51] Int. Cl.² .................... H01L 23/48; H01L 29/44; H01L 29/52
[52] U.S. Cl. ........................ 357/68; 357/79; 357/81; 357/65
[58] Field of Search ............ 357/67, 68, 74, 79, 357/81, 65

[56] References Cited

U.S. PATENT DOCUMENTS

| | | | |
|---|---|---|---|
| 3,573,574 | 4/1971 | Davis | 357/79 |
| 3,686,541 | 8/1972 | Livezey | 357/81 |
| 3,789,248 | 1/1974 | Jaecklin et al. | 357/79 |
| 3,875,438 | 4/1975 | Tharman | 357/79 |
| 4,008,487 | 2/1977 | Vogt | 357/81 |

Primary Examiner—Andrew J. James
Attorney, Agent, or Firm—Lowell E. Clark

[57] ABSTRACT

A semiconductor diode package which permits improved thermal and mechanical connection in soldered assemblies. Structural features which result in this improvement comprise double contacting studs having tapered end portions and an area somewhat larger than the semiconductor diode, and an organic encapsulant which seals the diode and the ends of the studs soldered to the diode while leaving the tapered ends of the studs exposed.

10 Claims, 3 Drawing Figures

U.S. Patent
June 6, 1978
4,093,958
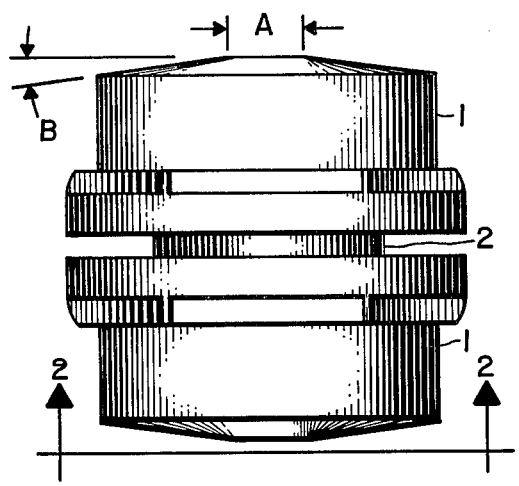
FIG. 1
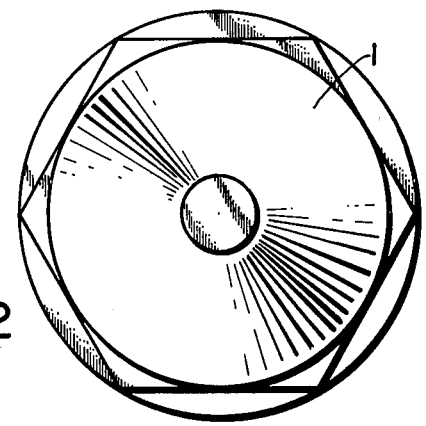
FIG. 2
FIG. 3
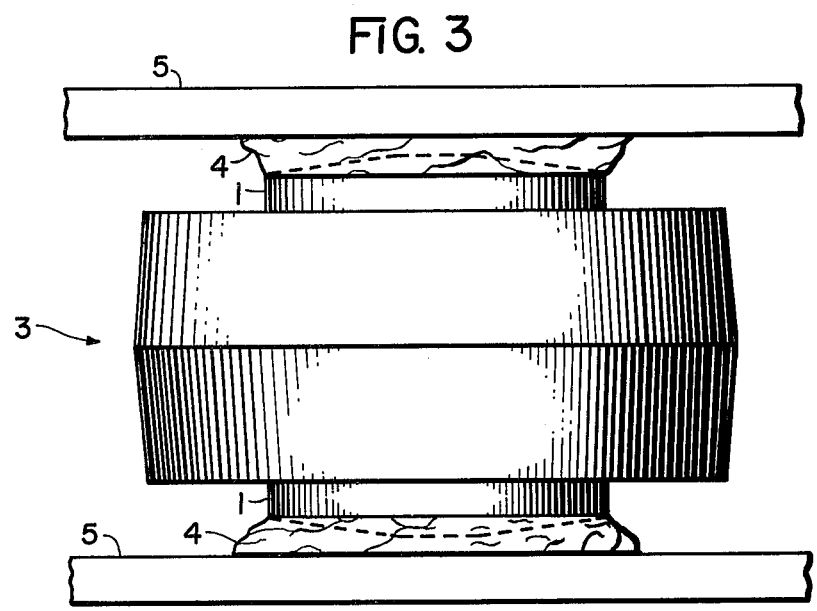

SEMICONDUCTOR DEVICE ASSEMBLY WITH IMPROVED FATIGUE RESISTANCE

SUMMARY

Traditionally, diodes have been provided in axial leaded packages where one or both the axial conductors are wires. For example, double stud glass encapsulated diodes often have headed wire leads contacting both faces of a diode chip, with glass enclosing the headed portions and the chip to provide a compression seal. Because the leads must have a thermal coefficient of expansion chosen to provide the compression seal, they are usually poor thermal conductors, particularly in view of the low cross-sectional area of the wires.

Higher power dissipation packages are ordinarily fabricated by attaching the semiconductor chip to a massive heat sinking element, such as a threaded stud, and attaching a wire-like conductor to the opposite face of the diode, and then incorporating the diode into a welded package. In addition to being relatively expensive, this kind of a package can effectively remove heat from only one side of the diode. Yet higher power package incorporate massive heat sinks on both faces of the diode, and use expensive techniques such as spring compression mountings to achieve good electrical and thermal contact without damaging the diode. Such packages often have at least one threaded stud for attachment to the primary heat sink.

Where several moderately high power diodes must be provided in a single assembly, such as a bridge rectifier, the foregoing packaging techniques are too expensive. As an alternative, the semiconductor chips can be soldered directly to the metallic elements which constitute the primary heat sinks as well as interconnection elements. However, since power diodes generally have high breakdown voltages, this approach often results in contamination which degrades or destroys the blocking voltage of the diode, and creates a difficult interface between the diode manufacturer and the assembly manufacturer when these are different. Also such an assembly is ordinarily subject to thermal cycling stresses in operation, so the solder contact between the semiconductor diode chip and the metallic interconnection is very critical from a mechanical standpoint. This is due to the fact that the semiconductor and the solder generally have very different thermal expansion coefficients.

In order to provide semiconductor rectifiers suitable for soldering into assemblies where power dissipation and thermal cycling capabilities are both required, an improved low-cost package has been devised. The semiconductor diode chip is soldered between two metal studs selected to have good thermal conductivity. These studs have a cross-section somewhat larger than the semiconductor die, and the length of the studs is kept to a minimum. One or both of the studs are provided with a tapered or generally convex external ends, which facilitate the soldering into the assembly. Such a taper allows escape of any gases trapped during the soldering operation, and provides a minimum thickness solder fillet along the axis of the diode, where the temperature is the highest. The solder fillet is thickest at its external surface, where heat dissipation is less important but where cracks are initiated during thermal cycling. The semiconductor diode and the inner ends of the studs are surrounded with an organic encapsulant which protects the sensitive lateral surface of the chip from the ambient and to insulate the studs from each other. The studs are provided with locking means to help prevent rotation of the encapsulant which would destroy the seal between it and the studs.

THE DRAWINGS

FIG. 1 is a side view of the diode package showing the tapered studs sandwiching the semiconductor diode.

FIG. 2 is a section through FIG. 1 showing the locking means on the studs.

FIG. 3 is a side view in cross-section of a packaged diode whose tapered studs are soldered to external metallic surfaces.

DESCRIPTION

FIG. 1 shows semiconductor diode chip 2 between two conductive studs 1 with tapered external portions. The studs 1 have a generally circular cross-section as shown in FIG. 2, and may have flat external end portions of dimension A adjacent the taper so that the package can be oriented perpendicular to flat parallel mounting surfaces. The studs have flanges on their surfaces adjacent the die and non-circular locking means such as the hexagonal shape in FIG. 2 to retain the organic encapsulant 3 in FIG. 3. The semiconductor chip 2 is soldered to the studs 2 prior to the molding of the encapsulant 3. For a semiconductor chip of 150 mils on a side, the studs have a diameter of about 250 mils and flat end parts whose dimension A is about 50 mils. Angle B is 3°-8°, preferably about 6°. The various structural features of the studs are formed by cold heading copper stock.

FIG. 3 shows a cross-section of a completed diode package soldered between metal members 5. Organic encapsulation 3 has been molded around the semiconductor chip 2 and the inner ends of the studs. Solder fillets 4 have a minimum thickness of about 1 mil between the metal plates 5 and the flat outer end portion of the stud 1; the thickness at the circumference of the stud is of course determined by the angle B and will be about 7-20 mils. This thicker solder portion provides the strength necessary to keep peripheral cracks from developing under thermal cycling of the assembly.

EXAMPLE

A 150 mil square semiconductor diode chip which has been nickel and gold plated on both faces is soldered between copper studs which have been formed from 225 mil diameter stock and nickel plated. The solder consists of 92.5% lead, 5% indium, and 2.5% silver by weight. The assembly thus formed is about 250 mils long. The exposed edges of the diode chip are coated with a silicone elastomer. Epoxy is transfer molded to form a housing which is about 400 mils in diameter and about 200 mils thick and surrounds the chip and the inner portions of both studs which contain the flanges and locking means. The diode package thus formed was then soldered between a steel plate and a flexible copper strap using a 96.5% tin - 3.5% silver by weight solder paste with an acid flux.

In order to evaluate the effect of the taper, diodes were also assemblied using studs with no taper on the external ends, i.e., with plane parallel ends normal to the axis of the package. Both tapered and non-tapered units were then soldered between a steel plate and a flexible copper strap and evaluated on a thermal cycling test consisting of repetitive 50 ampere surges of five minute duration. These forward current pulses raised the temperature as measured on the back of the mounting plate from an ambient value of 35° to 135° C, after which the assembly was allowed to cool to ambient. The non-tapered assemblies failed by developing soldered cracks between the package and the external plates after two to three thousand cycles. Packages with the tapered ends were found to withstand in excess of ten thousand cycles without such failures.

What is claimed is:

1. An axial-leaded semiconductor assembly comprising conducting studs soldered directly to the major surfaces of a semiconductor chip, each of said studs having a cross-sectional area larger than said major surface and having a tapered extremity away from said surfaces, said assembly being substantially symmetrical about said chip.

2. The assembly of claim 1, where said tapered extremities are substantially symmetrical about the major axis of said assembly.

3. The assembly of claim 1, where major portions of said tapered extremities lie at an angle between 3° and 8° to a plane parallel to said major surfaces.

4. The assembly of claim 3 where the extremities of said studs away from said surfaces further having plane portions parallel to the plane of said surfaces.

5. The assembly of claim 1 further including an organic encapsulant encircling said chip and said studs.

6. The assembly of claim 5 further including locking means radially inhomogeneous about the major axis for retaining said encapsulant.

7. The assembly of claim 1 further including conducting members soldered to said tapered extremities.

8. The assembly of claim 7, where the thickness of the solder fillet between the conductive members and the tapered extremities varies by about 7–20 mils.

9. A semiconductor assembly comprising a semiconductor chip and tapered conducting means each soldered to conducting surfaces to control the solder thickness variation between about 7 and 20 mils.

10. The assembly of claim 9 where said tapered conducting means are each soldered to said semiconductor chip.

* * * * *